(12) United States Patent
Yan

(10) Patent No.: US 7,078,136 B2
(45) Date of Patent: Jul. 18, 2006

(54) THERMALLY-GENERATED MASK PATTERN

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/737,551

(22) Filed: Dec. 15, 2003

(65) Prior Publication Data

US 2004/0126675 A1    Jul. 1, 2004

Related U.S. Application Data

(62) Division of application No. 09/895,739, filed on Jun. 30, 2001, now Pat. No. 6,756,158.

(51) Int. Cl.
*G03F 9/00* (2006.01)

(52) U.S. Cl. .......................................................... 430/5

(58) Field of Classification Search ...................... 430/5
See application file for complete search history.

(56) References Cited

U.S. PATENT DOCUMENTS

| | | | |
|---|---|---|---|
| 4,393,127 A | 7/1983 | Greschner et al. | |
| 5,429,896 A | 7/1995 | Hasegawa et al. | |
| 5,503,950 A | 4/1996 | Miyake et al. | |
| 6,178,221 B1 | 1/2001 | Levinson et al. | |

*Primary Examiner*—Christopher G. Young
(74) *Attorney, Agent, or Firm*—George Chen

(57) ABSTRACT

A mask having a first region and a second region; the first region having a multilayer mirror over a substrate, the multilayer mirror having alternating layers of a first material and a second material, the first material having a high index of refraction, the second material having a low index of refraction; and the second region having a compound of the first material and the second material over the substrate.

14 Claims, 1 Drawing Sheet

THERMALLY-GENERATED MASK PATTERN

This is a Divisional application of Ser. No.: 09/895,739, filed Jun. 30, 2001, now U.S. Pat. No. 6,756,158.

BACKGROUND OF THE INVENTION

1. Field of the Invention

The present invention relates to the field of semiconductor integrated circuit manufacturing, and more specifically, to a method of creating a pattern on an EUV mask blank without particles and an EUV mask blank made with such a method.

2. Discussion of Related Art

During the fabrication of integrated circuits (IC), each semiconductor wafer is subdivided into small identical fields that are adjacent to each other. Each field includes one or more IC chips. A radiation-sensitive material, such as photoresist, is coated onto the wafer. Then a scanner with a reduction projection system is used to scan radiation across a mask and onto one field at a time to expose portions of the photoresist. The mask determines the pattern to be transferred to the wafer through the process of exposing, developing, and etching.

Deep ultraviolet (DUV) lithography uses a transmissive mask at 248 nanometers (nm), 193 nm, or 157 nm to print features with a critical dimension (CD) of 100–180 nm. Next generation lithography (NGL), such as extreme ultraviolet (EUV) lithography, can print features with smaller CD. For example, an EUV scanner may use 4 imaging mirrors and a Numerical Aperture (NA) of 0.10 to achieve a CD of 50–70 nm with a depth of focus (DOF) of about 1.00 micrometer (um). Alternatively, an EUV scanner may use 6 imaging mirrors and a NA of 0.25 to print a CD of 20–30 nm although the DOF will be reduced to about 0.17 um.

EUV lithography uses a reflective mask for exposure since nearly all condensed materials are highly absorbing in the EUV wavelength range of 11–15 nm. An EUV mask may be fabricated from an EUV mask blank after the EUV mask blank has been inspected for defects and repaired. In order to identify the location of the defects, a pattern, such as a fiducial mark, is etched into the reflective surface of an EUV mask blank. However, etching produces particles that may contaminate tools and degrade process yield.

Thus, what is needed is a method of creating a pattern on an EUV mask blank without generating particles and an EUV mask blank made with such a method.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

A mask is used in lithography to define a desired pattern in photoresist on a wafer. Extreme ultraviolet (EUV) lithography uses a reflective mask for exposure since nearly all condensed materials are highly absorbing in the EUV wavelength range of 11–15 nm. An EUV mask is fabricated from an EUV mask blank after the EUV mask blank is inspected for defects. Fiducial marks are needed on the EUV mask blank to serve as a reference for identifying the location of the defects. The present invention includes a method of creating a pattern, such as a fiducial mark, on an EUV mask blank without generating particles and an EUV mask blank made with such a method.

Figure 1:
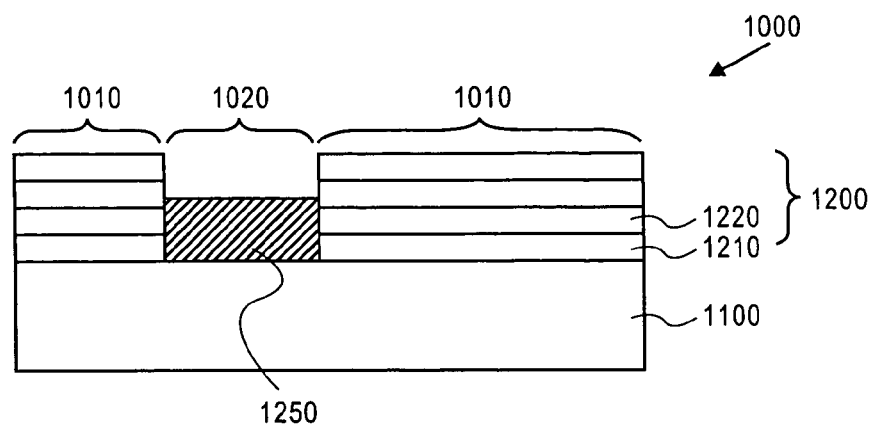
FIG. 1 is an illustration of a cross-sectional view of an EUV mask having a mark according to the present invention.

FIG. 1 shows an embodiment of an EUV mask blank 1000 according to the present invention. The EUV mask blank 1000 has a first region 1010 and a second region 1020. The first region 1010 is a multilayer mirror 1200 disposed over a substrate 1100. The multilayer mirror 1200 has 20–80 pairs of alternating layers of a high index of refraction material 1210, such as Molybdenum, and a low index of refraction material 1220, such as Silicon.

The second region 1020 is a compound, such as Molybdenum Silicide, of the high index of refraction material 1210 and the low index of refraction material 1220 that is disposed over a substrate 1100. The upper surface of the second region 1020 is lower than the upper surface of the first region 1010. The difference in step height between the first region 1010 and the second region 1020 defines a feature 1250 in a pattern, such as a fiducial mark.

Various embodiments of a method of creating a pattern, such as a fiducial mark, on an EUV mask blank 1000 according to the present invention will be described next.

Figure 2A:
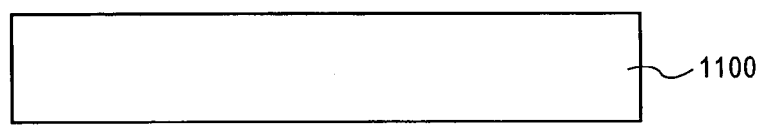
FIG. 2 (a)–(c) are illustrations of a cross-sectional view of a method of heating to fabricate a mark on an EUV mask.
Figure 2B:
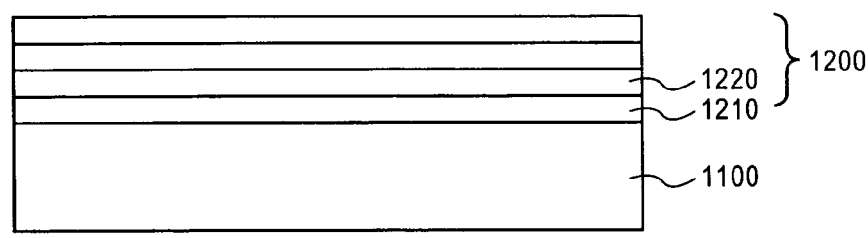
Figure 2C:
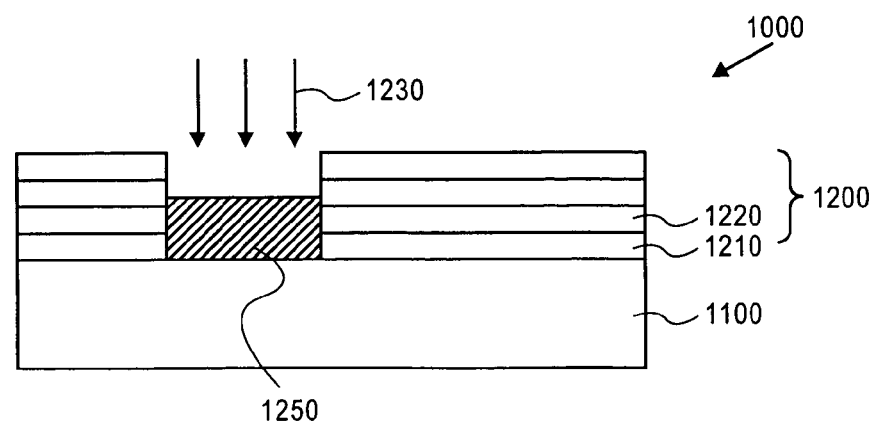

First, a substrate 1100 having a low coefficient of thermal expansion (CTE), a smooth surface, and a low defect level is used as the starting material for an EUV mask of the present invention. An embodiment is shown in FIG. 2 (a). The substrate 1100 may be formed out of a glass-ceramic material with the desired properties.

Second, a multilayer (ML) mirror 1200 is formed over the substrate 1100 since an EUV mask operates on the principle of a distributed Bragg reflector. An embodiment is shown in FIG. 2 (b). The ML mirror 1200 includes about 20–80 pairs of alternating layers of a high index of refraction material 1210 and a low index of refraction material 1220. The thickness uniformity should be better than 0.8% across the substrate 1100.

In one embodiment, the ML mirror 1200 includes 40 pairs of alternating layers of a high index of refraction material 1210 and a low index of refraction material 1220. The high index of refraction material 1210 may be formed from about 2.8 nm thick Molybdenum while the low index of refraction material 1220 may be formed from about 4.1 nm thick Silicon. As needed, a capping layer (not shown), such as about 11.0 nm thick Silicon, may be formed over the ML mirror 1200 to prevent oxidation of Molybdenum at the upper surface of the ML mirror 1200 in an EUV mask. The ML mirror 1200 can achieve a peak reflectivity of about 60–75% at the EUV central illumination wavelength of about 13.4 nm.

Ion beam deposition (IBD) or direct current (DC) magnetron sputtering may be used to form the ML mirror 1200 over the substrate 1100. IBD results in less perturbation and fewer defects in the upper surface of the ML mirror 1200 because the deposition conditions may be optimized to smooth over a defect on the substrate 1100. DC magnetron sputtering is more conformal, thus producing better thickness uniformity, but any defect on the substrate 1100 will tend to propagate up through the alternating layers to the upper surface of the ML mirror 1200.

Third, a beam 1230 is used to locally heat a desired region of the ML mirror 1200. An embodiment is shown in FIG. 2(*c*). The heating time may be as short as a few seconds. Heating the desired region of the ML mirror 1200 to a temperature of 300–800 degrees C. will result in interdiffusion of the thin alternating layers of high index of refraction material 1210, such as Molybdenum, and low index of refraction material 1220, such as Silicon. The interdiffusion will form a different material, such as a compound of Molybdenum Silicide, that occupies a smaller volume than the original ML mirror 1200.

The contraction, or reduction in volume, will create a difference in step height between the heated region and the surrounding unheated regions of the ML mirror 1200. The difference in step height defines a feature 1250 in a pattern, such as a fiducial mark. If desired the beam 1230 may be tilted or rotated to create different slopes or angles in the sidewalls of the feature 1250 in a pattern. The beam 1230 may be collimated or focused to help obtain the desired profile.

The heating process may be adjusted to vary the extent and rate of contraction to avoid any undesirable deformation or other damage that may be induced by thermal or mechanical stress. Unlike in an etching process, a heating process does not remove any material so no particle is formed. Any particle is undesirable since it may contaminate a tool or degrade yield.

In one embodiment, the beam 1230 is an electron beam. The range of the secondary electrons and the scattered electrons may be optimized by adjusting the acceleration voltage. In another embodiment, the beam 1230 is an ion beam. Sputtering, ion implantation, and knock-on should be avoided. In still another embodiment, the beam 1230 is an optical beam, such as a laser beam that has a continuous wave or is pulsed. The transmission and reflectivity characteristics of the ML mirror 1200 should be considered in selecting the appropriate wavelength and bandwidth.

The beam 1230 may be scanned through a field aperture to define a feature 1250 in a pattern that differs in size from the beam 1230. Scanning may also be used to create a feature 1250 in a pattern that differs in shape from the beam 1230. Scanning may be helpful in improving the uniformity of the heating.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of creating a pattern on an EUV mask blank without generating particles and an EUV mask blank made with such a method.

I claim:

1. An EUV mask blank comprising:
    a first region and a second region;
        said first region not covered by an absorber, said first region comprising a capping layer disposed over a multilayer mirror, said multilayer mirror comprising alternating layers of a first material and a second material disposed over a substrate, said multilayer mirror comprising a peak reflectivity of 60–75%; and
        said second region comprising a third material disposed over said substrate, said third material being different from said first material and said second material.

2. The EUV mask blank of claim 1 wherein said first material comprises Molybdenum, said second material comprises Silicon, and said third material comprises Molybdenum Silicide.

3. The EUV mask blank of claim 1 wherein a difference in step height between said first region and said second region defines a feature in a pattern on said EUV mask blank.

4. The EUV mask blank of claim 1 wherein said capping layer comprises silicon.

5. The EUV mask blank of claim 4 wherein said capping layer prevents oxidation at an upper surface of said first region.

6. The EUV mask blank of claim 3 wherein said pattern comprises a fiducial mark.

7. The EUV mask blank of claim 6 wherein said fiducial mark serves as a reference for identifying location of defects.

8. An EUV mask blank comprising:
    an upper surface with a difference in step height, said step height comprising:
        a higher portion comprising a capping layer disposed over a multilayer mirror, said multilayer mirror comprising alternating layers of a first material and a second material disposed over a substrate, said multilayer mirror comprising a peak reflectivity of 60–75% said higher portion not covered by an absorber and
        a lower portion comprising fiducial marks over said substrate and
    a lower surface without a difference in step height.

9. The EUV mask blank of claim 8 wherein said fiducial marks have sidewalls with different slopes.

10. The EUV mask blank of claim 8 wherein said fiducial marks have sidewalls with different angles.

11. The EUV mask blank of claim 8 wherein said fiducial marks comprise a third material, said third material being different from said first material and said second material.

12. The EUV mask blank of claim 8 wherein said fiducial marks comprise Molybdenum Silicide.

13. The EUV mask blank of claim 8 wherein said fiducial marks serve as a reference for identifying location of defects.

14. The EUV mask blank of claim 8 wherein said capping layer comprises silicon.

* * * * *